United States Patent
He et al.

(10) Patent No.: US 9,159,785 B2
(45) Date of Patent: Oct. 13, 2015

(54) SEMICONDUCTOR DEVICE HAVING BURIED LAYER AND METHOD FOR FORMING THE SAME

(71) Applicant: SEMICONDUCTOR MANUFACTURING INTERNATIONAL (SHANGHAI) CORPORATION, Shanghai (CN)

(72) Inventors: Jiwei He, Shanghai (CN); Gangning Wang, Shanghai (CN); Shannon Pu, Shanghai (CN); Mike Tang, Shanghai (CN); Amy Feng, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 41 days.

(21) Appl. No.: 14/020,790

(22) Filed: Sep. 7, 2013

(65) Prior Publication Data

US 2014/0077342 A1    Mar. 20, 2014

(30) Foreign Application Priority Data

Sep. 18, 2012 (CN) .......................... 2012 1 0349799

(51) Int. Cl.
| | | |
|---|---|---|
| *H01L 29/06* | (2006.01) | |
| *H01L 21/225* | (2006.01) | |
| *H01L 21/74* | (2006.01) | |
| *H01L 21/762* | (2006.01) | |
| *H01L 29/732* | (2006.01) | |
| *H01L 29/08* | (2006.01) | |

(52) U.S. Cl.
CPC ........ *H01L 29/0623* (2013.01); *H01L 21/2253* (2013.01); *H01L 21/74* (2013.01); *H01L 21/76213* (2013.01); *H01L 21/76224* (2013.01); *H01L 29/0821* (2013.01); *H01L 29/732* (2013.01)

(58) Field of Classification Search
CPC ..................... H01L 21/76823; H01L 21/2253; H01L 21/74; H01L 29/0623; H01L 29/732; H01L 29/0626; H01L 29/407; H01L 29/8725; H01L 29/872; H01L 29/66143
USPC ................. 438/524, 268, 207, 510, 570, 958; 257/629, 475, E29.338, E21.361, 257/E29.317, E21.135
See application file for complete search history.

(56) References Cited

U.S. PATENT DOCUMENTS

| | | | |
|---|---|---|---|
| 7,575,969 B2 | 8/2009 | Leipold | |
| 8,049,276 B2 * | 11/2011 | Yedinak et al. | ............... 257/341 |
| 2010/0044792 A1 * | 2/2010 | Hebert | ........................ 257/341 |
| 2010/0200910 A1 * | 8/2010 | Yedinak et al. | ............... 257/328 |
| 2010/0314707 A1 * | 12/2010 | Yedinak et al. | ............... 257/475 |
| 2013/0049102 A1 * | 2/2013 | Bobde et al. | ..................... 257/330 |

* cited by examiner

*Primary Examiner* — Thinh T Nguyen
(74) *Attorney, Agent, or Firm* — Anova Law Group, PLLC

(57) ABSTRACT

Semiconductor devices having a buried layer and methods for forming the same are disclosed. In an exemplary method, a hard mask layer can be provided on a semiconductor substrate. The hard mask layer can have a plurality of through-openings. A plurality of deep trenches can be formed in the semiconductor substrate using the hard mask layer as a mask. A bottom of each of the plurality of deep trenches in the semiconductor substrate can be doped to form a plurality of heavily-doped regions. One or more of the plurality of heavily-doped regions can be connected to form the buried layer in the semiconductor substrate. There is thus no need to use an epitaxial process to form active regions. In addition, lateral isolation structures can be simultaneously formed in the semiconductor substrate.

17 Claims, 4 Drawing Sheets

SEMICONDUCTOR DEVICE HAVING BURIED LAYER AND METHOD FOR FORMING THE SAME

CROSS-REFERENCES TO RELATED APPLICATIONS

This application claims priority to Chinese Patent Application No. CN201210349799.6, filed on Sep. 18, 2012, the entire contents of which are incorporated herein by reference.

FIELD OF THE DISCLOSURE

The present disclosure relates to the field of semiconductor technology and, more particularly, relates to semiconductor devices having a buried layer and methods for forming the same.

BACKGROUND

Semiconductor buried layers are widely used in integrated circuit (IC) devices and manufacturing processes. Particularly, semiconductor buried layers are widely used in semiconductor devices including transistors, diodes, and metal-oxide-semiconductor (MOS) transistors in IC processes that require high performance. Development of the buried layer technology greatly affects IC performance and IC manufacturing process development.

Buried layer technology may reduce on-resistance of the IC devices and may improve degree of integration and anti-interference capability, thereby reducing power consumption and parasitic capacitance to increase efficiency of the IC devices. Specifically, for a bipolar junction transistor (i.e., BJT or bipolar transistor), presence of a buried layer can reduce resistance of the collector and improve characteristic frequency. Further, presence of a heavily doped N-type buried layer can effectively prevent the thin epitaxial layer, the lightly-doped collector region epitaxial layer, from being fully converted to a space potential barrier region by a reverse bias voltage, thereby effectively improving the voltage tolerance of the bipolar transistor device.

A conventional buried layer process may include the following steps: (1) providing a substrate and forming an oxide layer on the substrate, the oxide layer reducing occurrence of ion tunneling effect during ion implantation and protecting lattice arrangement of the substrate surface; (2) using a photoresist pattern to form an opening for doping a buried layer; (3) forming the buried layer by doping atoms in the substrate, based on the photoresist pattern; and (4) removing the photoresist pattern and the oxide layer and then forming an epitaxial layer over the entire substrate surface.

As such, conventional methods for forming a buried layer need to form an epitaxial layer on the substrate after forming the buried layer. However, due to high manufacturing cost of the epitaxial process, manufacturing cost of the IC devices is increased.

BRIEF SUMMARY OF THE DISCLOSURE

According to various embodiments, there is provided a method for forming a buried layer by providing a hard mask layer on a semiconductor substrate. The hard mask layer can have a plurality of through-openings. A plurality of deep trenches can be formed in the semiconductor substrate using the hard mask layer as a mask. A bottom of each of the plurality of deep trenches in the semiconductor substrate can be doped to form a plurality of heavily-doped regions. One or more of the plurality of heavily-doped regions can be connected to form the buried layer in the semiconductor substrate.

According to various embodiments, there is also provided a semiconductor device having a buried layer. The semiconductor device can include a hard mask layer on a semiconductor substrate. The hard mask layer can have a plurality of through-openings configured to form a plurality of deep trenches in the semiconductor substrate using the hard mask layer as a mask. A plurality of heavily-doped regions can be formed at a bottom of each of the plurality of deep trenches in the semiconductor substrate. The buried layer can include one or more of the plurality of heavily-doped regions connected in the semiconductor substrate.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

When forming a buried layer, an epitaxial layer needs to be formed on a substrate after formation of the buried layer. Such epitaxial process has relatively high manufacturing cost with more process steps. To reduce the cost of IC manufacturing and number of process steps, a method for forming a buried layer is provided. In this method, a plurality of deep trenches can be formed in a substrate. The bottom of the plurality of deep trenches can be heavily ion doped. After performing drive-in process of a plurality of heavily-doped regions, the plurality of heavily-doped regions can be laterally connected to form a buried layer.

According to different substrate types, appropriate dopant ions can be selected. For example, dopant ions for an N-type substrate can be trivalent elements, while dopant ions for a P-type substrate can be pentavalent elements. The formed buried layer can be located within the substrate. Active regions can include isolated silicon islands having a certain thickness disposed above the buried layer and between adjacent deep trenches. As disclosed, there is no need to form an epitaxial layer on the substrate. Thus, manufacturing cost can be significantly reduced comparison with conventional methods that require formation of an epitaxial layer.

FIGS. 1-8 depict cross-sectional views of an exemplary semiconductor device having a buried layer at various stages during its formation in accordance with various disclosed embodiments. FIG. 9 depicts an exemplary method for forming an exemplary semiconductor device having a buried layer in accordance with various disclosed embodiments.

Figure 1:
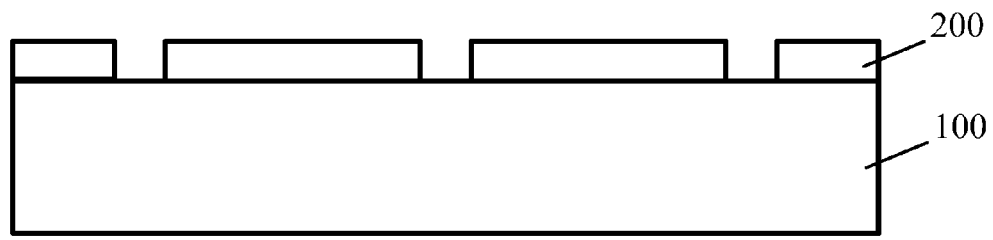
FIGS. 1-8 depict cross-sectional views of an exemplary IC device having a buried layer at various stages during formation in accordance with various disclosed embodiments.

In Step 01 of FIG. 9 and referring to FIG. 1, a semiconductor substrate 100 is provided. A hard mask layer 200 is formed on the surface of the semiconductor substrate 100. The hard mask layer 200 can include a plurality of openings, e.g., through-openings.

The semiconductor substrate 100 can be a substrate of N-type or P-type lightly-doped silicon, germanium, silicon-germanium, and/or gallium arsenide. For example, the semiconductor substrate 100 can be P-type lightly-doped bulk silicon.

In one embodiment, the hard mask layer material 200 can be made of tetraethyl orthosilicate (TEOS). In other embodiments, the hard mask layer may be made of oxide and/or nitride including, e.g., silicon oxide and/or silicon oxynitride. A method for forming the hard mask layer 200 having the plurality of openings can include, for example, first forming a hard mask layer (e.g., a TEOS layer) on surface of the semiconductor substrate 100 and then forming a photoresist layer on surface of the hard mask layer, e.g., by a spin coating. The photoresist layer can then be patterned by exposure and development. The patterned photoresist layer can be used as a mask to etch the hard mask layer to expose the surface of the semiconductor substrate 100 to form the plurality of openings in the hard mask layer 200. The plurality of openings can expose the surface of the semiconductor substrate 100. The positions of the plurality of openings can define the positions for etching the semiconductor substrate 100 to form a plurality of deep trenches in subsequent steps.

Figure 2:
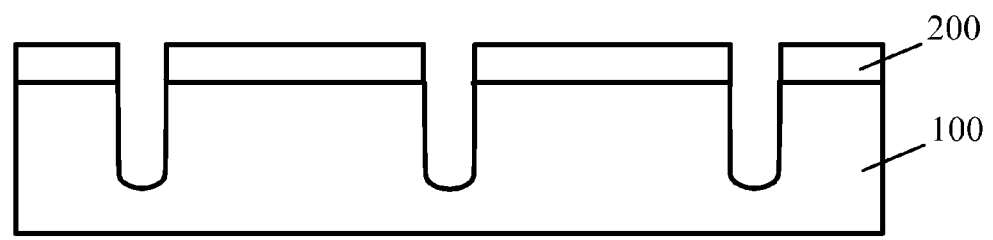

In Step 02 of FIG. 9 and referring to FIG. 2, a plurality of deep trenches can be formed in the semiconductor substrate 100 using the hard mask layer 200 as a mask.

In some embodiments, the process for forming the plurality of deep trenches can include, for example, a plasma etching. In other embodiments, dry etching processes can be used including, for example, reactive ion etching, sputtering etching, magnetic field enhanced reactive ion etching, reactive ion beam etching, and/or high-density plasma etching. In dry etching processes (e.g., a plasma etching), an anisotropic etching can be performed and the etching rate can be directional. The dry etching processes can avoid formation of, e.g., lateral undercut etching under the hard mask layer and/or formation of V-shaped deep trenches, which may often occur during a wet etching.

In a wet etching, the etch rate in each direction can depend on the crystal orientation of the semiconductor substrate 100, the formed plurality of V-shaped deep trenches can have a relatively great width. In addition, the opening of a V-shaped deep trench on the surface of the substrate 100 can be wider than the bottom of the V-shaped deep trench, the effective and usable area on the surface of the semiconductor substrate 100 may be reduced.

When the dry etching is used, the sidewall of a formed deep trench can be substantially vertical (e.g., with respect to a horizontal bottom of the deep trench). Compared with a V-shaped deep trench formed in a wet etching, the width of the deep trench with vertical sidewall can have a greater controllability. For example, a deep trench having a controllable short width can be formed. Thus, the area covered by the opening of the deep trench on the surface of the semiconductor substrate 100 can be reduced. This can increase the effective usable area of the semiconductor substrate 100.

The plurality of deep trenches can have a depth ranging from about 5 microns to about 8 microns, and a substantially vertical sidewall having an angle (with respect to the bottom of the deep trench) ranging from about 89° to about 90°.

Figure 3:
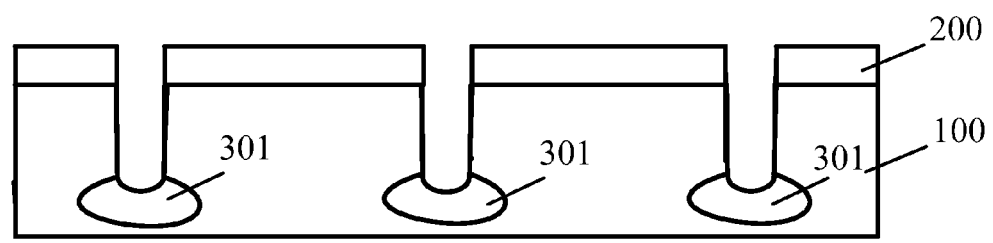

In Step 03 of FIG. 9 and referring to FIG. 3, a plurality of heavily-doped regions 301 can be formed in the substrate 100 at the bottom of the plurality of deep trenches, e.g., by a plasma doping. In various embodiments, the plurality of heavily-doped regions 301 can be formed in the substrate 100 by an ion implantation.

The subsequent formation of a buried layer in the semiconductor substrate 100 can be used to provide a vertical isolation between the semiconductor substrate 100 and any electronic device formed thereon. For example, a buried layer can be used to form a collector of a bipolar transistor to reduce parasitic resistance of the collector. Therefore, the doping type of the buried layer can be varied according to the type of the semiconductor substrate 100. When the semiconductor substrate 100 is made of a P-type lightly-doped semiconductor material, the ion source of the ion implantation can be pentavalent elements including, for example, phosphorus, arsenic, and/or antimony. The pentavalent dopant ions can form an N-type buried layer in the semiconductor substrate 100.

When the semiconductor substrate 100 is made of an N-type lightly-doped semiconductor material, the ion source of the ion implantation can be trivalent elements, for example, including boron, indium, and/or gallium. The trivalent dopant ions can form a P-type buried layer in the semiconductor substrate 100. The buried layer and the semiconductor substrate 100 can form a P-N junction. The P-N junction can form a vertical isolation between the semiconductor substrate 100 and the electronic device through a reverse bias.

In one embodiment, the substrate can be a P-type lightly-doped silicon substrate, the ion source of the ion implantation can be pentavalent elements. For example, the dopant element can be phosphorus. The implantation energy can range from about 20 keV to about 60 keV. The dose can range from about $1 \times 10^{15}$ atoms per square centimeter (atoms/cm$^2$) to about $1 \times 10^{16}$ atoms/cm$^2$, and can result in a doping concentration ranging from about $1 \times 10^{20}$ atoms per cubic centimeter (atoms/cm$^3$) to about $1 \times 10^{21}$ atoms/cm$^3$.

By ion implantation, the plurality of heavily-doped regions 301 can be formed at the bottom of the plurality of deep trenches. Each one of the plurality of heavily-doped regions 301 can be located near the bottom of one of the plurality of deep trenches. The plurality of heavily-doped regions 301 can be discrete.

During the ion implantation process, the direction of the ion dopant can be perpendicular to the bottom of the plurality of deep trenches, and the plurality of deep trenches can have substantially vertical sidewalls and small openings. Therefore, each one of the plurality of heavily-doped regions 301 can be concentrated at the bottom of one of the plurality of deep trenches, while the plurality of heavily-doped regions 301 formed by ion implantation cannot be formed in the semiconductor substrate 100 near the sidewall of the plurality of deep trenches.

Figure 4:
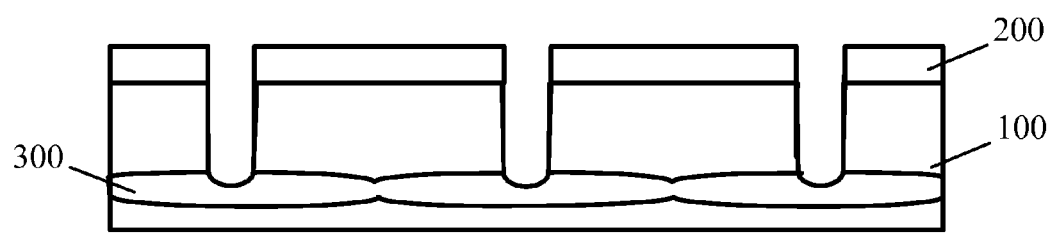

In Step 04 of FIG. 9 and referring to FIG. 4, a high-temperature drive-in process is performed to connect one or more of the plurality of heavily-doped regions 301, to form a buried layer 300. The buried layer 300 can be a continuous layer or at least partially continuous.

Most ions may not be located in displacement positions during ion implantation. Therefore, to activate the doped ions and to restore mobility and other material parameters, the semiconductor substrate 100 may need a high-temperature treatment for an appropriate time period under an appropriate temperature. Furthermore, because the depth and width of ion implantation can be limited, the plurality of heavily-doped regions 301 may not be connected with each other (shown in FIG. 3). Therefore, a drive-in process may be needed to promote the lateral diffusion and vertical diffusion of the dopant ions and form the buried layer 300. In one embodiment, phosphorus can be used as the dopant element. Phosphorus can have a faster diffusion rate over other pentavalent elements such as antimony, and can result in better lateral diffusion of the plurality of heavily-doped regions 301 to form the buried layer 300 that is continuous and N-type.

Figure 5:
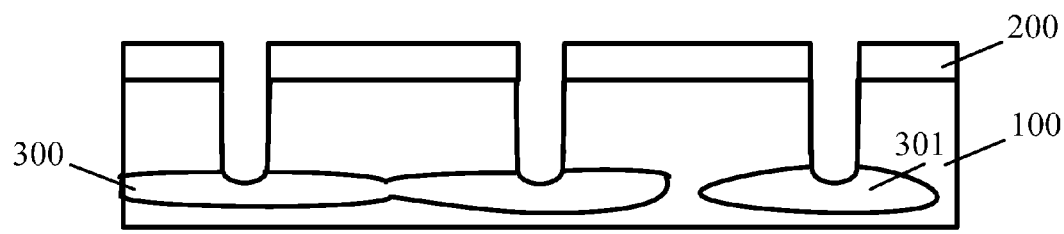

In some embodiments, after the drive-in process of the plurality of heavily-doped regions 301, due to the influence of parameters such as diffusion rate of the dopant elements, drive-in time and drive-in temperature, etc., there are still potentially issues such as insufficient lateral diffusion and/or discontinuity between the plurality of the heavily-doped doped regions 301. As a result, a number of the plurality of heavily-doped regions 301 can still be discrete in the semiconductor substrate 100 (as shown in FIG. 5). For example, the drive-in process to form the buried layer can be performed at a temperature ranging from about 1100° C. to about 1200° C. for a time period ranging from about 4 hours to about 5 hours. In other embodiments, the time period of the drive-in process can range from about 4 hours to about 10 hours, according to the requirements of the practical fabrication process.

Different devices can be subsequently formed in different regions in the semiconductor substrate 100, and can have different voltage requirements. Therefore, according to the different voltage requirements of the devices, formation of a discontinuous buried layer can be needed in different regions of the devices. Thus, in other embodiments, according to the requirements of the practical circuit, parameters of the drive-in process and distance between each of the deep trenches can be varied or otherwise controlled to form a partially continuous buried layer.

Because the buried layer 300 can be formed within the semiconductor substrate 100, there can be portions of the semiconductor substrate 100 between each of the plurality of deep trenches and above the buried layer 300, which can form a plurality of isolated silicon islands. The plurality of silicon islands can still have a certain thickness. The thickness can meet the requirements from the subsequently formed semiconductor devices on the semiconductor substrate 100. The plurality of silicon islands can serve as a plurality of active regions 120 (as shown in FIG. 6).

Because the plurality of active regions 120 of a certain thickness can be located above the formed buried layer 300, there is no need for additional epitaxy process for forming active regions. Thus, unlike conventional methods, the disclosed methods can reduce the high-cost epitaxial process steps, and can reduce the IC manufacturing cost.

Figure 6:
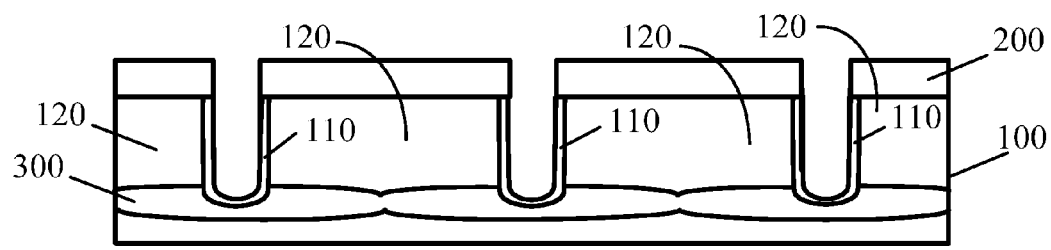

In Step 05 of FIG. 9 and referring to FIG. 6, an oxide layer 110 is formed on the inner surface of the sidewall and bottom of the plurality of deep trenches.

In some embodiments, the process for forming the oxidation layer 110 on the inner wall of the plurality of deep trenches can include a thermal oxidation process. In other embodiments, other dry oxidation and/or wet oxidation processes can be used.

The process of etching the plurality of deep trenches (referring to FIG. 2) may cause some damage to the inner wall of the plurality of deep trenches. Forming the oxide layer 110 can repair the damage on the inner wall of the plurality of deep trenches. In addition, the oxide layer 110 can provide isolation between the plurality of deep trenches and the semiconductor substrate 100, and between each portion of the semiconductor substrate 100 on both sides of each of the deep trenches (i.e., active regions 120). The oxide layer 110 can repair the damage on the inner wall of the plurality of deep trenches to reduce surface defects. As a result, in the subsequent step of filling the plurality of deep trenches, the quality of deposition can be improved. For a better isolation effect, in some embodiments, the oxidation layer 110 can be sufficiently thick. For example, the thickness of the oxide layer 110 can be about 2000 Å or any other suitable thickness. In other embodiments, the thickness of the oxide layer 110 can be greater than about 2000 Å.

Figure 7:
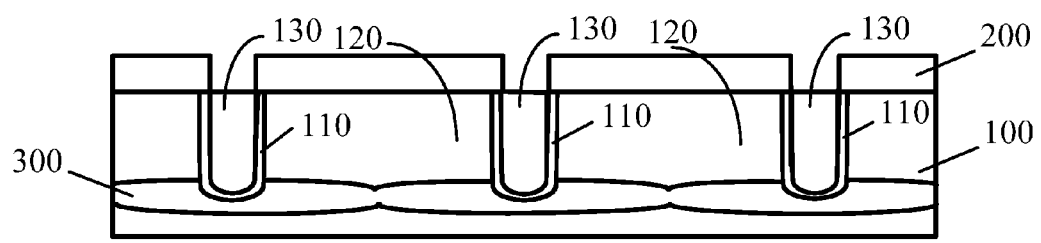

In Step 06 of FIG. 9 and referring to In FIG. 7, the plurality of deep trenches is filled by a filling material to form isolation structures 130. The filling material can include polysilicon, oxide, nitride, or a combination thereof.

In some embodiments, the inner wall of the plurality of deep trenches can be oxidized in a tube furnace growth process, followed by a chemical deposition process, e.g., a chemical vapor deposition process, to fill the plurality of deep trenches. In other embodiments, other chemical deposition processes can also be used to fill the plurality of deep trenches.

In some embodiments, the filling material can include polysilicon. During the deposition process, after the plurality of deep trenches are filled, some of the filling material may be deposited at the openings of the hard mask layer 200 and on the surface of the hard mask layer 200. A further etch-back process can be used to remove the filling material deposited at the openings of the hard mask layer 200 and on the surface of the hard mask layer 200. As a result, the surface of the filling material in the deep trenches can be flat and leveled with the surface of the semiconductor substrate 100.

In other embodiments, silicon oxide, silicon nitride and/or silicon oxynitride can be used to fill the plurality of deep trenches. In addition, a mixture of polysilicon and oxide, or other conductive materials can be used as the filling material.

When filled with an insulating material, the plurality of deep trenches can serve as lateral isolation structures between active regions of the semiconductor devices. When filled with conductive materials such as polysilicon, the deep trenches can be connected with the buried layer 300 through holes formed in the oxide layer 110 at the bottom of the deep trenches. Thus, the buried layer 300 can be connected with device terminals.

After the plurality of deep trenches are filled, due to the thick oxide layer 110 between the sidewall of the plurality of deep trenches and the filling material, the plurality of deep trenches can become the isolation structures 130, thus creating lateral isolation within the semiconductor substrate 100.

In conventional methods, after the formation of the buried layer, an epitaxial layer needs to be formed. Further, in order to provide lateral isolation between semiconductor devices, according to practical needs, lateral trench isolation structures are formed in the epitaxial layer, or alternatively, P-N junction isolation is formed by ion implantation and a drive-in process. As disclosed herein, the plurality of deep trenches can be formed before the formation of the buried layer 300. At the same time of providing vertical isolation between the semiconductor substrate 100 and the semiconductor devices, lateral isolation structures can be formed in the semiconductor substrate 100 through the formation of the oxide layer 110 on the inner wall of the deep trenches. Compared with convention methods, process steps can be reduced.

Figure 8:
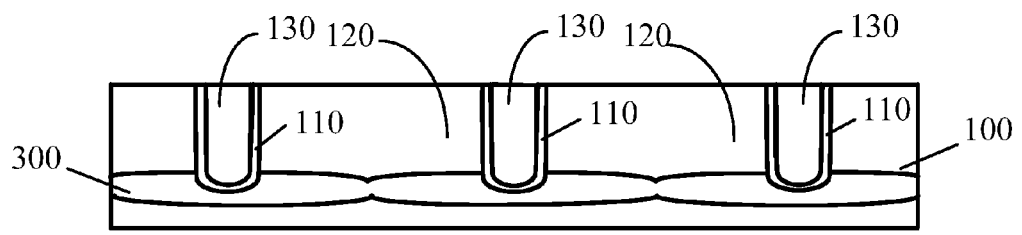
Figure 9:
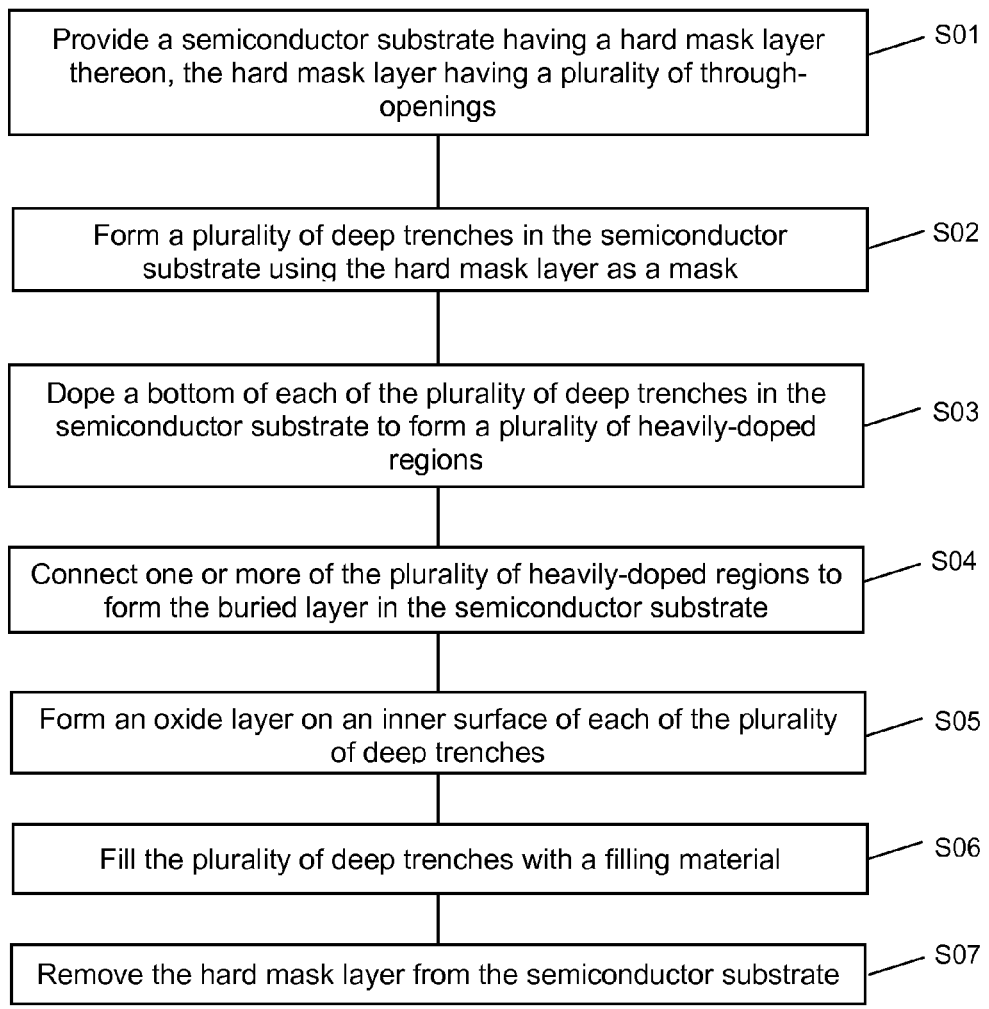
FIG. 9 depicts an exemplary method for forming an exemplary IC device having a buried layer in accordance with various disclosed embodiments.

In Step 07 of FIG. 9 and referring to FIG. 8, the hard mask layer 200 on the semiconductor substrate 100 is removed. After formation of the buried layer 300 and the filling of the plurality of deep trenches, the hard mask layer 200 can be removed to expose the surface of the semiconductor substrate 100.

In other embodiments, after the hard mask layer 200 is removed, according to specific semiconductor devices to be subsequently formed, the active regions 120 formed above the buried layer and between each of the plurality of deep trenches can be doped. For example, to form bipolar junction transistor (BJT) devices in the semiconductor substrate 100 between the deep trenches, the active regions 120 can be N-type doped to form N-type lightly-doped regions. The doping concentration in the active regions 120 can be lower than the doping concentration in the buried layer 300, and the BJT devices can be formed in the N-type lightly-doped regions. The process of forming the BJT devices in the N-type lightly-doped regions is known in the art.

In a specific embodiment, a P-type semiconductor substrate can be provided having a hard mask layer (e.g., TEOS) with a plurality of through-openings. A plurality of deep trenches can be formed in the semiconductor substrate, e.g., by an etching process using the hard mask layer as an etching mask. A bottom of each of the plurality of deep trenches can be heavily doped to form a plurality of N-type heavily-doped regions (e.g., by ion implantation). A drive-in process can be performed to laterally connect one or more of the plurality of heavily-doped regions to form a buried layer. An oxide layer can then be formed on an inner surface (including surfaces of sidewall and bottom) of each of the plurality of deep trenches, which can then be filled with a filling material (e.g., polysilicon). Portions of the filling material disposed at the plurality of through-openings of the hard mask layer and on the surface of the hard mask layer can be removed using an etch-back process (i.e., forming a recess at each of the through-opening in the hard mask layer). The hard mask layer can then be removed from the semiconductor substrate.

In this method, a hard mask layer having a plurality of openings can be formed as a mask to form a plurality of deep trenches in a substrate using anisotropic dry etching process. The deep trenches have substantially-vertical sidewalls with respect to the substrate. By controlling the size of the openings of the hard mask layer, the deep trenches with substantially short width can be formed in the substrate to provide a relatively large effective and usable area available on the surface of the substrate. Heavily-doped regions can be formed at the bottom of the deep trenches by ion doping, and can then form a buried layer through a drive-in process. The drive-in process can cause the dopant ions in the heavily-doped regions to further diffuse in lateral and vertical directions, and can cause the heavily-doped regions to be laterally connected to form the buried layer. Isolated silicon islands having a certain thickness can be formed above the buried layer and between adjacent deep trenches and can be used as active regions. There is thus no need to form active regions using an epitaxial process. Manufacturing cost can thus be effectively reduced.

In addition, different semiconductor devices subsequently formed in different regions in the substrate can require different voltages. The parameters of the drive-in process, e.g., time and/or temperature, can be varied to vary the diffusion range and diffusion rate of the dopant ions in the heavily-doped regions in the different regions in the substrate. Alternatively, the distance between adjacent deep trenches can be varied. As a result, a continuous buried layer or a buried layer having isolated heavily-doped regions can be formed, in order to meet the requirements of different devices.

The disclosed methods can further include forming an oxide layer having a certain thickness on the inner surface of the deep trenches. Because the oxide layer can be an insulating material, after reaching the certain thickness, the oxide layer can be used as an isolation layer to form lateral isolation structures in the substrate. Thus, the buried layer can be used as lateral isolation structures in the substrate. In this manner, process steps can be simplified and manufacturing cost can be reduced. Further, the oxide layer can repair the damage on the inner surface of the deep trenches from the etching process to ensure interface quality for the subsequent filling process of the deep trenches.

The active regions above the buried layer and on both sides of each of the deep trenches can be doped according to the properties/requirements of semiconductor devices to be formed in the substrate. In the method for forming the buried layer as disclosed herein, after the formation of the buried layer, various semiconductor devices, e.g., a BJT, a vertical double-diffused metal-oxide-semiconductor field-effect transistor (VDMOS), a lateral double-diffused metal-oxide-semiconductor field-effect transistor (LDMOS), and/or a Zener Diode, etc., can be formed in the active regions between adjacent deep trenches. Thus, the disclosed methods can be significant for improving performance, integration, and isolation of the semiconductor devices. For example, to form BJT devices in the active regions between the deep trenches, N-type ions can be doped in the active regions to form N-type lightly-doped regions for forming the BJT as desired.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a buried layer, comprising:
providing a semiconductor substrate including a hard mask layer thereon, wherein the hard mask layer has a plurality of through-openings;
forming a plurality of deep trenches in the semiconductor substrate using the hard mask layer as a mask;
doping a bottom of each of the plurality of deep trenches in the semiconductor substrate to form a plurality of heavily-doped regions;
connecting one or more of the plurality of heavily-doped regions to form the buried layer in the semiconductor substrate;
after the buried layer is formed, forming an oxide layer on an inner surface of sidewalls and a bottom of each of the plurality of deep trenches; and
filling the plurality of deep trenches with a filling material on sidewalls and a bottom of the oxide layer in each deep trench to form isolation structures between adjacent active regions in the semiconductor substrate.

2. The method of claim 1, wherein the hard mask layer is made of a material including tetraethyl orthosilicate (TEOS), an oxide, a nitride, or a combination thereof.

3. The method of claim 1, wherein the plurality of deep trenches is formed in the semiconductor substrate by a dry etching.

4. The method of claim 1, wherein the plurality of deep trenches have a depth ranging from about 5 microns to about 8 microns and a sidewall angle with a surface of the semiconductor substrate ranging from about 89° to about 90°.

5. The method of claim 1, wherein the semiconductor substrate is made of a P-type lightly-doped material and the bottom of each of the plurality of deep trenches is doped by a pentavalent element including phosphorus, arsenic, antimony, or a combination thereof.

6. The method of claim 1, wherein the semiconductor substrate is made of an N-type lightly-doped material and the bottom of each of the plurality of deep trenches is doped by a trivalent element including boron, indium, gallium, or a combination thereof.

7. The method of claim 1, wherein the bottom of each of the plurality of deep trenches is doped having an implantation energy ranging from about 20 keV to about 60 keV, a dose ranging from about $1\times10^{15}$ atoms/cm$^2$ to about $1\times10^{16}$ atoms/cm$^2$, and a doping concentration ranging from about $1\times10^{20}$ atoms/cm$^3$ to about $1\times10^{21}$ atoms/cm$^3$.

8. The method of claim 1, wherein the one or more of the plurality of heavily-doped regions are laterally connected by a high-temperature drive-in process to form the buried layer in the semiconductor substrate.

9. The method of claim 8, wherein the high-temperature drive-in process is performed at a temperature ranging from about 1100° C. to about 1200° C., and for a time period ranging from about 4 hours to about 10 hours.

10. The method of claim 1, wherein a portion of the semiconductor substrate between the buried layer and adjacent deep trenches of the plurality of deep trenches includes an isolated silicon island, wherein the isolated silicon island includes the active region for forming a semiconductor device.

11. The method of claim 1, further including:
   forming the oxide layer on the inner surface of the sidewalls and the bottom of each of the plurality of deep trenches by a dry oxidation process, a wet oxidation processes, or a combination thereof, after the connecting of the one or more of the plurality of heavily-doped regions to form the buried layer.

12. The method of claim 1, wherein a thickness of the oxide layer is about 2000 Å.

13. The method of claim 12, wherein:
   the filling material for forming the isolation structures includes an oxide, a nitride or a combination thereof.

14. The method of claim 1, wherein the plurality of deep trenches are filled by a chemical vapor deposition process.

15. The method of claim 1, wherein the filling of the plurality of deep trenches further includes:
   removing the filling material from the plurality of through-openings of the hard mask layer and from the surface of the hard mask layer using an etch-back process.

16. The method of claim 1, further including removing the hard mask layer from the semiconductor substrate.

17. The method of claim 10, further including:
   doping the isolated silicon island with a doping concentration lower than a doping concentration for doping the bottom of each of the plurality of deep trenches in the semiconductor substrate for forming the plurality of heavily-doped regions.

* * * * *